(12) United States Patent
Hoffnagle et al.

(10) Patent No.: US 6,295,168 B1
(45) Date of Patent: Sep. 25, 2001

(54) REFRACTIVE OPTICAL SYSTEM THAT CONVERTS A LASER BEAM TO A COLLIMATED FLAT-TOP BEAM

(75) Inventors: John Allen Hoffnagle; Carl Michael Jefferson, both of San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/461,365

(22) Filed: Dec. 15, 1999

(51) Int. Cl.[7] .................................................. G02B 13/18
(52) U.S. Cl. ..................... 359/708; 359/745; 359/748; 359/691; 359/692
(58) Field of Search ................................ 359/668, 708, 359/642, 709–718, 680, 686–692, 745–748

(56) References Cited

U.S. PATENT DOCUMENTS

| | | |
|---|---|---|
| 3,476,463 | 11/1969 | Kreuzer . |
| 5,099,358 | * 3/1992 | Okazaki ............................... 359/503 |
| 5,293,269 | 3/1994 | Burkhart et al. . |
| 5,373,395 | 12/1994 | Adachi . |
| 5,572,367 | 11/1996 | Jung et al. . |

OTHER PUBLICATIONS

Muhammad Arif, Meer M. Hossain, Abdul Ahad S. Awwal and Muhammad N. Islam, Applied Optics, *Two–Element Refracting System for Annular Gaussian–to–Bessel Beam Transformation*, vol. 37, No. 19, Jul. 1, 1998, pp. 4206–4209.

Noriaki Nishi, Takahisa Jitsuno, Koji Tsubakimoto, Masahiro Nakatsuk and Sadao Nakai, Technology Reports of the Osaka University, *Control of the Laser Beam Irradiation Intensity Distribution Using Aspherical Multi Lens Array and Edge–Shaped Plates*, vol. 45, No. 2209, Apr. 1995, pp. 35–42.

Koshichi Nemoto, Takashi Fujii and Masahiro Nagano, SPIE, *Laser Beam Forming by Fabricated Aspherical Mirror*, vol. 2375, 1995, pp. 103–108.

Jeffrey J. Kasinski and Ralph L. Burnham, Optics Letters, *Near–Diffraction–limited Laser Beam Shaping with Diamond–Turned Aspheric Optics*, vol. 22, No. 14, Jul. 15, 1997, pp. 1062–1064.

Gábor Erdei, Gábor Szarvas, Emöke Lörincz and Sándor Várkonyi, SPIE, *Single–Element Refractive Optical Device for Laser Beam Profiling*, vol. 3100, 1997, pp. 400–412.

\* cited by examiner

*Primary Examiner*—Georgia Epps
*Assistant Examiner*—Michael A. Lucas
(74) *Attorney, Agent, or Firm*—Thomas R. Berthold.; Banner & Witcoff, Ltd (57) ABSTRACT

An optical system having a first positive optical element having an aspherical surface; and a second positive optical element having an aspherical surface. The first and second optical elements are arranged in a Keplerian configuration. The aspheric surface of the second optical element is related to the aspheric surface of the first optical element by a ray-tracing function that maps substantially all of an input light beam that is incident to the first optical element to a collimated output light beam that is output from the second optical element. The input light beam has a first axially-symmetric intensity distribution, such as a Gaussian intensity distribution, and the output light beam has a second axially-symmetric intensity distribution, such as a continuous, sigmoidal intensity distribution. Preferably, the output light beam has a Fermi-Dirac intensity distribution, and the ray-tracing function maps the input light beam to the output beam to a $1/e^6$ intensity radius of the input light beam.

15 Claims, 4 Drawing Sheets

REFRACTIVE OPTICAL SYSTEM THAT CONVERTS A LASER BEAM TO A COLLIMATED FLAT-TOP BEAM

BACKGROUND OF THE INVENTION

1. Field of the Invention

The present invention relates to the field of optics. More particularly, the present invention relates to an optical system that transforms a light beam having any axially-symmetric intensity distribution to a light beam having another axially-symmetric intensity distribution.

2. Description of the Related Art

Lasers emitting collimated beams of coherent light have many applications in optical science and technology, including lithography, spectroscopy, communications and display technology. Due to fundamental properties of light propagation in optical resonators, most lasers emit beams having a light intensity that is extremely inhomogeneous. Specifically, the light intensity frequently follows a Gaussian distribution, such as $$I(r) = (2P/\pi w^2) e^{-2r^2/w^2}, \quad (1)$$

where I(r) denotes the optical power per unit area measured at a distance r from the axis of the beam, P denotes the total power of the beam, and w is the beam waist parameter, which sets the length scale over which the optical intensity declines from its maximum value to zero. The same distribution also describes, to a good approximation, the intensity profile of a beam that emerges from a single-mode optical fiber, such as is used extensively in the optical industry for conveying coherent light.

For many applications, it is desirable that some area of interest be illuminated as uniformly as possible. For example, optical lithography, which is used to fabricate microelectronic devices, requires that the light fluence over an entire exposed region conform to tight tolerances. Laser users, therefore, frequently encounter the problem of transforming a beam having a Gaussian intensity profile to a so-called flat-top profile, which has a uniform intensity over a region of arbitrary radius a.

Many solutions have been proposed for transforming a Gaussian beam to a flat-top beam. All conventional solutions, however, have significant drawbacks. For example, the conceptually-simplest conventional method uses an element having radially-varying absorption for removing excess intensity from the center of a beam. Such an approach is inherently inefficient because it can be shown that, in the best case, the fraction of the incident beam power that emerges in the apodized beam is 1/e, or approximately 37%. Moreover, in this conventional approach, the absorptive element only subtends the central part of the incoming beam, having an aperture or other discontinuity located at a point where the light intensity is an appreciable fraction of the peak intensity.

When using spatially coherent light sources, including most lasers, any aperture that truncates the beam also diffracts light into the central region. Accordingly, interference of the diffracted and transmitted light reduces the uniformity of the beam. Yet another drawback of this conventional approach is that stable, well-characterized absorptive materials are required, which are not available for the technologically-important ultraviolet wavelengths.

Another conventional approach uses lithographically or holographically fabricated phase gratings for reshaping a Gaussian beam by diffraction. Holographic gratings suffer from limited diffraction efficiency of only about 30%, as well as a lack of materials that are suitable for ultraviolet applications. Lithographically-fabricated phase gratings can have high efficiency, but are expensive to fabricate and only work as designed for a single wavelength. Additionally, it is exceedingly difficult to avoid diffraction into unwanted orders, leading to undesirable effects, such as non-uniformity of the output beam at high spatial frequencies and "hot spots" on the beam axis.

Conventional refractive solutions have been proposed that use either spherical or aspheric optical elements for aberrating and then recollimating a laser beam. The solutions with conventional spherical optics are physically bulky and relatively inefficient because the spherical surfaces introduce limited aberrations. More compact and efficient conventional designs have been proposed that use either aspheric or gradient-index lenses. Nevertheless, use of a gradient index accomplishes essentially the same result as an aspheric surface, but having a drawback that no gradient-index glasses are available for ultraviolet applications. All aspheric and gradient-index solutions that until now have been analyzed in detail have used a negative first element and a positive second element in a configuration resembling a Galilean telescope. Unfortunately, such designs require lenses having large deviations from sphericity and are difficult to fabricate. Fabrication problems are especially acute for the concave surface of the first lens in the Galilean design.

Another serious problem with most conventional aspheric and gradient-index solutions is that such solutions are only valid for the central region of an incident beam, thereby entailing an aperture for the other discontinuity at a point where there is appreciable input beam intensity, at least $1/e^2$ times the peak intensity. As previously mentioned, truncating an input beam causes diffraction and interference fringes that reduce the uniformity of the output beam.

What is needed is a way to efficiently transform a light beam having any axially-symmetric intensity distribution to a light beam having another axially-symmetric intensity distribution.

SUMMARY OF THE INVENTION

The present invention provides an optical system that transforms a light beam having any axially-symmetric intensity distribution to a light beam having another axially-symmetric intensity distribution.

The advantages of the present invention are provided by an optical system having a first positive optical element having an aspherical surface; and a second positive optical element having an aspherical surface. According to the invention, the first and second optical elements are arranged in a Keplerian configuration, and the aspheric surface of the second optical element is related to the aspheric surface of the first optical element by a ray-tracing function that maps substantially all of an input light beam that is incident to the first optical element to a collimated output light beam that is output from the second optical element. The input light beam has a first axially-symmetric intensity distribution, such as a Gaussian intensity distribution, and the output light beam has a second axially-symmetric intensity distribution, such as a continuous, sigmoidal intensity distribution. Preferably, the output light beam has a Fermi-Dirac intensity distribution, and the ray-tracing function maps the input light beam to the output beam to a $1/e^6$ intensity radius of the input light beam.

BRIEF DESCRIPTION OF THE DRAWING

The present invention is illustrated by way of example and not limitation in the accompanying figures in which like reference numerals indicate similar elements and in which.

DETAILED DESCRIPTION

The present invention provides an optical system for transforming a light beam having any axially-symmetric intensity distribution to a light beam having another axially-symmetric distribution, with specific application to a transformation of a Gaussian beam to a flat-top beam. The present invention generates a uniform intensity laser beam from a Gaussian laser beam by radially redistributing the energy in the beam by introducing aberrations into the incident waveform using a first aspheric refractive element, and by removing the wavefront path differences of the redistributed rays and recollimating the beam using a second aspheric element.

The present invention has the advantages over conventional approaches in that the present invention is particularly efficient, nearly achromatic, practical for all wavelengths from deep ultraviolet to far infrared, is free of apertures that would cause diffraction of a coherent beam, and is easily manufacturable. These advantages are achieved by using a design procedure that takes into account essentially all the energy in the incoming beam (without truncating the beam at a radius for which there is appreciable intensity) and by using an optical configuration requiring only convex aspheric surfaces, which are especially practical for fabrication.

The present invention uses two essential features for producing a system that optically transforms an input light beam having an axially-symmetric intensity distribution into an output light beam having another axially-symmetric intensity distribution. The first essential feature is a pair of positive aspheric elements arranged in a Keplerian configuration. Not only does such a configuration eliminate fabrication difficulties associated with a concave aspheric surface, but detailed calculations show that the departure from sphericity of the aspheric surfaces used by the present invention is considerably less than that for a Galilean configuration performing the same optical transformation. Consequently, the present invention can be fabricated at a reasonable cost, whereas a conventional design having a negative element would be difficult to make.

The second essential feature of the present invention is that the entire input beam is mapped into an output beam having a large region of nearly uniform intensity in the center of the output beam in combination with a well-controlled roll-off of intensity at a large radius. While any physically realizable apparatus must have a finite aperture, the present invention allows the aperture to be arbitrarily large. Consequently, the aperture intercepts extremely little optical intensity, thereby introducing negligible diffraction effects. For example, a preferred embodiment of the present invention accepts an input beam out to the $1/e^6$ intensity radius of the beam, meaning that 99.7% of the incident optical power is controlled through the optical system without striking an aperture.

The mapping formalism of the present invention allows the beam to have any shape that is consistent with energy conservation. Unlike conventional approaches for generating a flat-top beam having a smooth roll-off, the present invention provides a computationally simple method for calculating the required aspheric surfaces. The preferred embodiment of the present invention uses a Fermi-Dirac function, but many other functions are possible. For example, a raised cosine or other functions found in the windowing of spectral distributions in digital signal processing, and the super-Gaussian profiles that have been considered in laser beam propagation theory can be used.

The combination of convex surfaces and large apertures of the present invention provides many important advantages that are not found in conventional designs. For example, the aspheric surfaces that are used have a monotonical radial dependence, that is, a monotonic taper from a center region of the aspheric surface. Consequently the aspheric surfaces of the present invention are practical to fabricate from high-quality optical materials, such as fused silica, optical glass, polymers, or crystalline materials. Moreover, designs of the present invention can be implemented at any wavelength for which a transparent material is available, including the technologically-important ultraviolet region. Through the use of materials having low dispersion, such as fused silica, it is possible to design a nearly achromatic system. For instance, the preferred embodiment of the present invention performs essentially equally-well over the entire wavelength range from 257 nm (ultraviolet) to 1550 nm (infrared) with only a single focus adjustment. Therefore, a single fabrication step can produce optics suitable for many applications. The aspheric surfaces provide particularly high efficiency (approximately 65%) and are designed in such a way that no apertures or other optical discontinuities exist that could diffract appreciable optical power into the uniform region of a beam.

In the following description of the present invention, a light source is assumed to emit a collimated, monochromatic, axially-symmetric beam of light. A cylindrical coordinate system can be defined for the beam of light in which a z-axis is parallel to the propagation direction of the beam and r denotes the radial distance from the z-axis. The optical intensity at any point in the beam can described by a function f(r). The general power redistribution problem is to find an optical system that transforms an input beam having an intensity distribution f(r) to a collimated output beam having another intensity distribution g(r). The input intensity distribution can be assumed to be normalized, that is, $$2\pi \int_0^\infty f(r) r \, dr = 1. \tag{2}$$

The present invention departs from conventional approaches for generating a power redistribution in that the present invention avoids the use of absorptive optics or apertures that would intercept appreciable optical intensity. Consequently, the present invention requires that the output intensity distribution also be normalized, that is, $$2\pi \int_0^\infty g(r) r \, dr = 1. \tag{3}$$

The present invention further provides that the output intensity distribution is continuous, in contrast to the step-function distributions that are often used in connection with conventional approaches.

Because the input and output beams are assumed to be collimated, rays enter and exit the apodizer of the present invention parallel to the z-axis. Consider a ray that enters at some arbitrary distance r from the z-axis and emerges at another distance R. The function R(r), which will be referred to herein as a ray-tracing function, is fundamental to the design of the optical system of the present invention and is directly related to the power redistribution problem. Function R(r) is required to be monotonic, which insures that the inverse transformation exists and that there are no caustic surfaces in the output. In accordance with energy conservation, the total power in the input beam enclosed by the ray that enters at r must be equal to the total power in the output beam' enclosed by the ray that exits at R, resulting in an implicit equation for the ray tracing function, $$\int_0^r f(s) s \, ds = \int_0^R g(s) s \, ds. \tag{4}$$

Equation (4) can be solved numerically for given input and output intensity distributions. Thus, the power redistribution problem, i.e., the choice of the functions f and g, determines the ray-tracing function. Collimation of the output beam, that is, the requirement that the output be a plane wave propagating parallel to the z-axis, requires that the optical path difference from the input pupil to the output pupil be the same for all rays. The ray tracing unction, constancy of the optical path difference, and Sneel's law generate a system of equations that completely define an optical system having two aspheric surfaces.

The present invention is based on two fundamental principles. First, the ray-tracing function in Eq. (4) also describes an optical system having two positive elements, resembling a Keplerian telescope, and having a real (aberrated) focus between the two elements. While the theoretical possibility of a Keplerian design has been previously noted, such an approach has been neglected because a Keplerian design requires greater refraction at the aspheric surfaces than a corresponding Galilean design having a negative first element and the same overall length. Nevertheless, a Keplerian design is, in fact, superior to a Galilean design because the aspheric surfaces of the present invention are considerably simpler to fabricate than the elements of the Galilean design.

Second, the output intensity distribution is required be continuous and properly normalized, which means that for large r, g(r) must tend to 0 faster than $r^2$. By imposing such conditions, an extra degree of complexity is introduced to the design process because g(r) must be chosen carefully for achieving a desired degree of uniformity over an illuminated region. Nevertheless, a controlled roll-off at the edge of the output beam is automatically obtained, which is extremely valuable for reducing diffraction effects and thereby maximizing depth-of-field. Use of only convex surfaces by the present invention provides much simpler and more easily fabricated optical elements, while at the same time providing superior performance.

Before considering a specific design, some quantitative figures of merit are introduced. Let the variable a denote the radius over which a uniform illumination is desired. Let $g_{min}$ and $g_{max}$ respectively denote the minimum and maximum values of g(r) within the region 0<r<a. The absolute uniformity of the output beam can be defined as $$U = g_{min}/g_{max}. \tag{5}$$

The efficiency $\eta$ of the system is defined as the fraction of the total beam power contained within the radius a. With normalization, the efficiency $\eta$ can be written as $$\eta = 2\pi \int_0^a g(s) s \, ds. \tag{6}$$

Both U and $\eta$ range from 0 to 1, with larger values being more desirable. Uniformity U and efficiency $\eta$ are not properties of the function g alone, but also depend on the radius a.

By far the most important special case of practical interest for an input intensity distribution is the Gaussian distribution, $$f(r) = (2/\pi w^2) e^{-2r^2/w^2}. \tag{7}$$

Such an intensity distribution closely describes the observed output of many gas lasers, solid-state lasers and the circularized output of diode lasers, as well as the radiation pattern of single-mode optical filters that are used for conveying light for optical communications and other applications. A Gaussian distribution also approximates the central lobe of a spatially filtered beam, which is often used in holography.

Inserting Eq. (7) into the definitions given by Eqs. (5) and (6), uniformity U and efficiency $\eta$ obey a simple relation. That is, $\eta = 1 - U$, implying that a high degree of uniformity can be obtained only at the expense of poor efficiency. If, for example, 95% uniformity is required, then only 5% of the laser power is actually useful. With the choice of a Gaussian input beam, the left-hand side of Eq. (4) is $$\int_0^R g(s) s \, ds = \frac{1}{2\pi} \left[ 1 - e^{-2r^2/w^2} \right]. \tag{8}$$

In general, the solution of Eq. (8) requires numerically integrating the function g, but this can easily be done to a high accuracy for the smooth output distributions that are considered herein.

The choice of an output intensity distribution is more problematic In the literature, functions of the type $$g(R) = \text{constant}, \; 0 < R < a, \tag{9}$$

are often found, with g(R) being undefined or 0 for R>a. Such an approach is likely to lead to unphysical discontinuities at R=a. To avoid such a problem, the present invention provides a continuous, sigmoidal function g(R) that satisfies the normalization condition of Eq. (3). Subject to these constraints, there is considerable freedom in choosing a function g. For example, even a piecewise definition for the output intensity distribution, such as a spline, is possible.

To generate a beam having a large region of nearly constant intensity, it is convenient to choose output intensity distribution function g to be a Fermi-Dirac distribution, $$g(R) = g_0 \bigg/ \left[1 + e^{\left(\frac{R-R_0}{W}\right)}\right], \quad (10)$$

where the constant $g_0$ is chosen to satisfy the normalization condition. The parameters $R_0$ and $W$ determine the shape of the function. When $W \ll R_0$, the intensity is nearly constant over a range that is comparable to $R_0$, then falls exponentially to 0 over a distance that is comparable to $W$. Other similar intensity distributions are also feasible. For example, the super-Gaussian distribution of order n, $$g(r) = g_0 e^{-2(R/R_0)^R}, \quad (11)$$

which rolls off much more rapidly at large R and for large n has a flat central region, is extremely similar to the distribution of Eq. (10).

Once the output intensity distribution g has been chosen, a numerical solution of Eq. (8) yields the ray-tracing function R(r). The refractive system of the present invention for which the ray-tracing function is realized is a configuration having two positive lenses, each of which has one aspheric surface, as shown schematically in FIG. 1.

Figure 1:
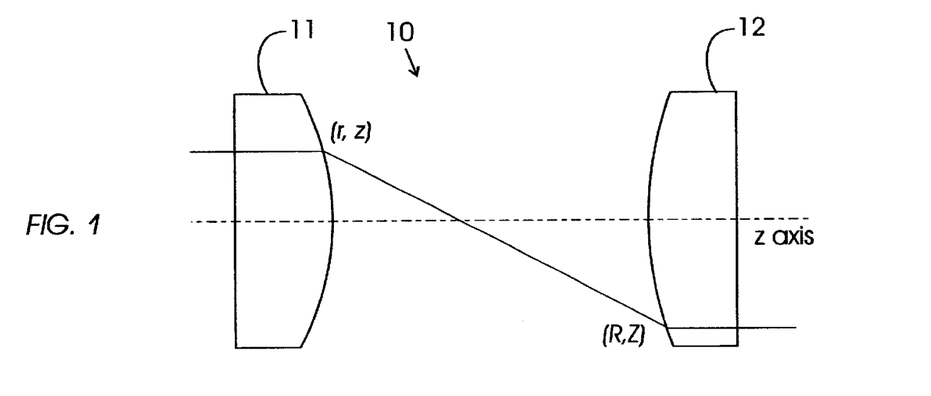
FIG. 1 shows a schematic view of a Keplerian aspheric apodizer according to the present invention.

More specifically, FIG. 1 shows a schematic view of a Keplerian aspheric apodizer 10 according to the present invention. Apodizer 10 includes a first aspheric lens 11 and a second aspheric lens 12. The respective aspheric surfaces of lenses 11 and 12 each have a monotonical radial dependence, that is, a monotonic taper from a center region of each aspheric surface. The surfaces of lenses 11 and 12 that are not aspheric are chosen to preferably be plano, but can be spherical surfaces without essentially changing the design of apodizer 10. Lenses 11 and 12 are preferably chosen to be made of the same material, thereby having the same index of refraction. It is trivial to generalize the design of the present invention to the case in which the lenses have different refractive indices.

The shapes required for the aspheric surfaces of the present invention can be computed using a commercially-available lens-design program. Alternatively, the aspheric surfaces can be calculated as follows:

Consider a ray that enters the optical system at some arbitrary radius r and exits at radius R, such as shown in FIG. 1. The ray is refracted by the first aspheric surface at point (r, z) and by the second aspheric surface at (R, Z). As previously mentioned, the desired energy redistribution determines the ray-tracing function R(r). Additionally, the requirement that the input and output beams be plane waves imposes the constraint that the optical path difference between the entrance and exit planes be the same for all rays. Expressing this constraint as a relation among r, z, R and Z, and using the ray-tracing function, Z can be solved for as a function of r and z. Snell's law relates the slope of the first refracting surface to r, z, R and Z. Using the ray-tracing function and the optical path difference relation for eliminating R and Z yields dz/dr as a function of r alone. This defines a single integral equation for the shape of the first aspherical surface, which is easily solved by well-known numerical methods. The resulting sag function z(r) for the first aspheric surface then determines the shape Z(R) of the second aspheric surface through the ray-tracing and optical path difference constraints. Similarly, a single integral equation for Z(R) can be written by following the same procedure with the order of the surfaces reversed.

The design procedure of the present invention was carried out for a choice of parameters that are applicable to a laboratory experiment. The input beam distribution was assumed to be Gaussian having $$w = 2.366 \text{ mm}. \quad (11)$$

The output beam profile that was chosen to be a Fermi-Dirac distribution having $$R_0 = 3.25 \text{ mm} \quad (12)$$

and $$W = 0.2 \text{ mm}. \quad (13)$$

Figure 2:
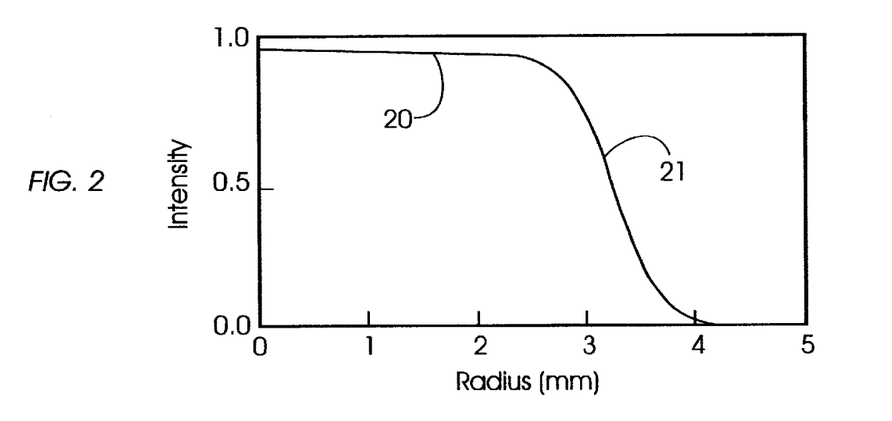
FIG. 2 is a graph showing a relative intensity distribution for a Fermi-Dirac distribution having $R_0=3.25$ mm and $W=0.2$ mm.

FIG. 2 is a graph showing the resulting relative intensity distribution $g(r)/g_0$ for a Fermi-Dirac distribution having $R_0=3.25$ mm and $W=0.2$ mm. In FIG. 2, a large region of nearly constant intensity is shown at 20 and a sharp, but smooth roll-off is shown at 21. The shape of the relative intensity distribution shown in FIG. 2 is determined solely by the ratio $W/R_0$.

Figure 3:
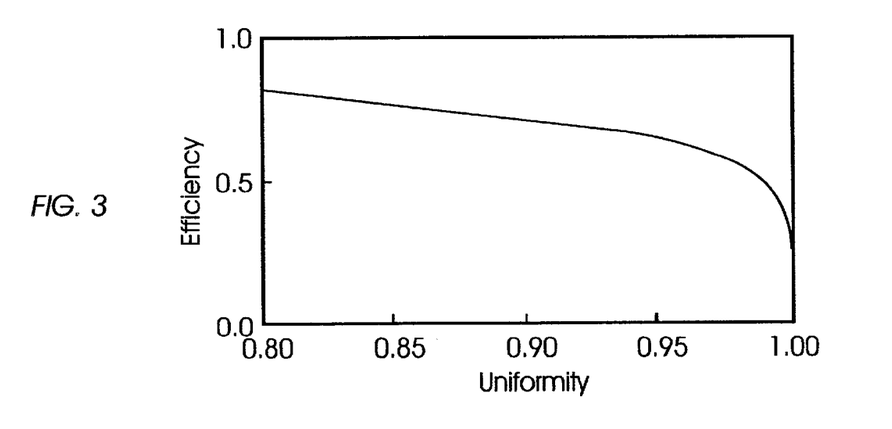
FIG. 3 is a graph showing the relationship between efficiency and uniformity for a selected Fermi-Dirac function.

Because of the continuous roll-off, the values of uniformity U and efficiency η are functions of the radius a of the illuminated area. FIG. 3 shows the relationship between efficiency and uniformity for the Fermi-Dirac function used for FIG. 2. FIG. 3 shows that 65% efficiency is possible with 95% uniformity.

In practice, the intensity distributions must be truncated at some point, so an input aperture of 4.056 mm radius and a corresponding output aperture of 4.06 mm radius were chosen. At this particular radius, the input intensity is reduced by a factor of $e^{-6}$ from its axial value, and 99.7% of the total input beam power is redistributed in the output beam. Consequently, aperture effects are not a concern.

The required aspheric surfaces were calculated assuming both lenses to be composed of fused silica, separated by 150 mm, and for a design wavelength of 532 nm. The resulting sag tables are presented in Table I.

TABLE I

| Radius (mm) | Asphere 1 (mm) | Asphere 2 (mm) |
|---|---|---|
| 0.00 | 0.000000 | 0.000000 |
| 0.05 | −0.000053 | 0.000027 |
| 0.10 | −0.000214 | 0.000109 |
| 0.15 | −0.000481 | 0.000246 |
| 0.20 | −0.000854 | 0.000438 |
| 0.25 | −0.001334 | 0.000684 |
| 0.30 | −0.001919 | 0.000985 |
| 0.35 | −0.002609 | 0.001340 |
| 0.40 | −0.003404 | 0.001751 |
| 0.45 | −0.004303 | 0.002216 |
| 0.50 | −0.005305 | 0.002737 |
| 0.55 | −0.006409 | 0.003312 |
| 0.60 | −0.007614 | 0.003943 |
| 0.65 | −0.008920 | 0.004628 |
| 0.70 | −0.010325 | 0.005369 |
| 0.75 | −0.011827 | 0.006165 |
| 0.80 | −0.013427 | 0.007017 |
| 0.85 | −0.015122 | 0.007924 |
| 0.90 | −0.016911 | 0.008887 |
| 0.95 | −0.018793 | 0.009906 |
| 1.00 | −0.020767 | 0.010980 |
| 1.05 | −0.022830 | 0.012111 |
| 1.10 | −0.024982 | 0.013297 |
| 1.15 | −0.027220 | 0.014541 |
| 1.20 | −0.029544 | 0.015840 |
| 1.25 | −0.031952 | 0.017197 |
| 1.30 | −0.034442 | 0.018610 |
| 1.35 | −0.037013 | 0.020081 |
| 1.40 | −0.039662 | 0.021609 |
| 1.45 | −0.042390 | 0.023194 |
| 1.50 | −0.045193 | 0.024838 |
| 1.55 | −0.048071 | 0.026539 |
| 1.60 | −0.051022 | 0.028300 |
| 1.65 | −0.054044 | 0.030118 |

TABLE I-continued

| Radius (mm) | Asphere 1 (mm) | Asphere 2 (mm) |
| --- | --- | --- |
| 1.70 | −0.057137 | 0.031997 |
| 1.75 | −0.060299 | 0.033934 |
| 1.80 | −0.063529 | 0.035932 |
| 1.85 | −0.066825 | 0.037990 |
| 1.90 | −0.070186 | 0.040108 |
| 1.95 | −0.073612 | 0.042288 |
| 2.00 | −0.077100 | 0.044530 |
| 2.05 | −0.080651 | 0.046834 |
| 2.10 | −0.084264 | 0.049201 |
| 2.15 | −0.087937 | 0.051631 |
| 2.20 | −0.091669 | 0.054126 |
| 2.25 | −0.095461 | 0.056686 |
| 2.30 | −0.099311 | 0.059311 |
| 2.35 | −0.103219 | 0.062004 |
| 2.40 | −0.107185 | 0.064764 |
| 2.45 | −0.111207 | 0.067593 |
| 2.50 | −0.115285 | 0.070492 |
| 2.55 | −0.119420 | 0.073462 |
| 2.60 | −0.123610 | 0.076504 |
| 2.65 | −0.127856 | 0.079621 |
| 2.70 | −0.132157 | 0.082813 |
| 2.75 | −0.136513 | 0.086083 |
| 2.80 | −0.140923 | 0.089432 |
| 2.85 | −0.145388 | 0.092862 |
| 2.90 | −0.149908 | 0.096376 |
| 2.95 | −0.154482 | 0.099975 |
| 3.00 | −0.159111 | 0.103662 |
| 3.05 | −0.163794 | 0.107440 |
| 3.10 | −0.168531 | 0.111310 |
| 3.15 | −0.173323 | 0.115275 |
| 3.20 | −0.178169 | 0.119337 |
| 3.25 | −0.183070 | 0.123498 |
| 3.30 | −0.188025 | 0.127760 |
| 3.35 | −0.193034 | 0.132123 |
| 3.40 | −0.198098 | 0.136589 |
| 3.45 | −0.203218 | 0.141158 |
| 3.50 | −0.208392 | 0.145831 |
| 3.55 | −0.213621 | 0.150608 |
| 3.60 | −0.218905 | 0.155487 |
| 3.65 | −0.224245 | 0.160469 |
| 3.70 | −0.229640 | 0.165552 |
| 3.75 | −0.235091 | 0.170737 |
| 3.80 | −0.240597 | 0.176020 |
| 3.85 | −0.246160 | 0.181403 |
| 3.90 | −0.251779 | 0.186883 |
| 3.95 | −0.257454 | 0.192459 |
| 4.00 | −0.263186 | 0.198131 |
| 4.05 | −0.268975 | 0.203897 |
| 4.10 | −0.274851 | 0.209749 |
| 4.15 | −0.280858 | 0.215612 |
| 4.20 | −0.287011 | 0.221454 |
| 4.25 | −0.293322 | 0.227263 |
| 4.30 | −0.299792 | 0.233044 |
| 4.35 | −0.306422 | 0.238808 |
| 4.40 | −0.313206 | 0.244572 |
| 4.45 | −0.320137 | 0.250349 |
| 4.50 | −0.327206 | 0.256151 |
| 4.55 | −0.334404 | 0.261986 |
| 4.60 | −0.341723 | 0.267862 |
| 4.65 | −0.349154 | 0.273785 |
| 4.70 | −0.356690 | 0.279757 |
| 4.75 | −0.364326 | 0.285782 |
| 4.80 | −0.372057 | 0.291863 |
| 4.85 | −0.379879 | 0.298001 |
| 4.90 | −0.387790 | 0.304198 |
| 4.95 | −0.395789 | 0.310454 |
| 5.00 | −0.403874 | 0.316770 |
| 5.05 | −0.412043 | 0.323148 |
| 5.10 | −0.420298 | 0.329587 |
| 5.15 | −0.428636 | 0.336088 |
| 5.20 | −0.437058 | 0.342652 |
| 5.25 | −0.445565 | 0.349279 |
| 5.30 | −0.454155 | 0.355969 |
| 5.35 | −0.462829 | 0.362722 |
| 5.40 | −0.471587 | 0.369539 |
| 5.45 | −0.480430 | 0.376419 |
| 5.50 | −0.489356 | 0.383363 |
| 5.55 | −0.498366 | 0.390371 |
| 5.60 | −0.507461 | 0.397443 |
| 5.65 | −0.516640 | 0.404579 |
| 5.70 | −0.525904 | 0.411779 |
| 5.75 | −0.535251 | 0.419044 |
| 5.80 | −0.544684 | 0.426373 |
| 5.85 | −0.554201 | 0.433766 |
| 5.90 | −0.563802 | 0.441225 |
| 5.95 | −0.573489 | 0.448747 |
| 6.00 | −0.583260 | 0.456335 |

The resulting surfaces are easily manufacturable. It is important to emphasize that the practicality of the present invention crucially depends on a Keplerian configuration. A Keplarian configuration always gives rise to lenses having monotonic surfaces, that is, lenses having a locally convex curvature with the same sign across the lens. Accordingly, convex surfaces are considerably simpler to grind and polish than are concave surfaces.

Figure 4:
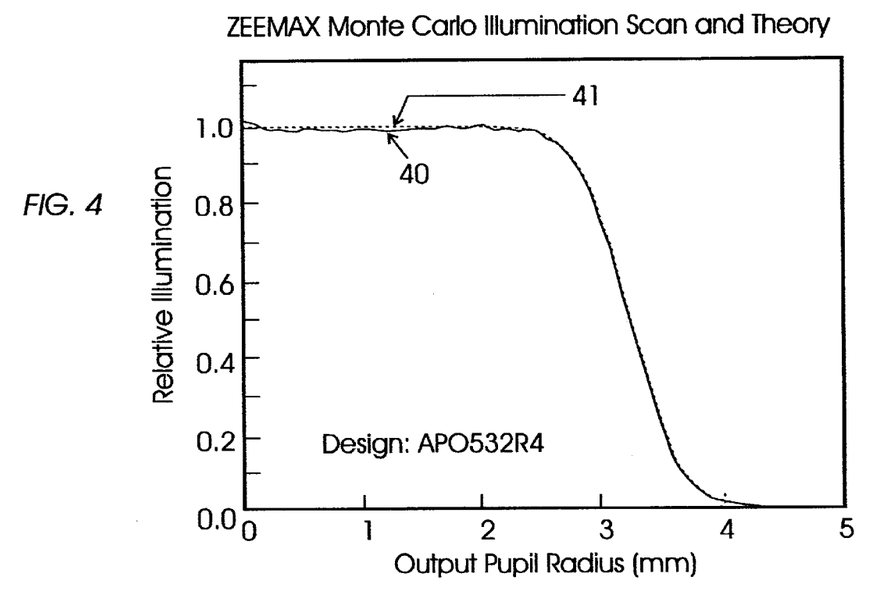
FIG. 4 is a graph showing an output intensity profile calculated by ray-tracing a large number of randomly selected input rays (points) in comparison to a desired Fermi-Dirac profile (line)

The output intensity distribution for the exemplary laboratory experiment was checked using a Monte-Carlo ray-tracing technique that did not rely on the transformation theory used for deriving Eq. (8). The result, shown in FIG. 4, provides independent confirmation that the optical design of the present invention provides the desired intensity redistribution. FIG. 4 shows an output intensity profile calculated using a Monte-Carlo scan by ray-tracing a large number of randomly selected input rays (points) 40 in comparison to a desired Fermi-Dirac profile (line) 41.

Use of a material having low dispersion, such as fused silica, provides an important advantage that the design is near achromatic. Calculations show that by providing an adjustable spacing between the two lenses, the prescription of Table I generates a diffraction-limited, collimated output beam over the entire wavelength range from 257 nm to 1550 nm. The shape of the output intensity distribution changes only slightly as the wavelength is changed from the design value of 532 nm, but a large, uniform central region is always present. Thus, only a single pair of lenses need to be fabricated for use with any light source within this spectral range.

Figure 5:
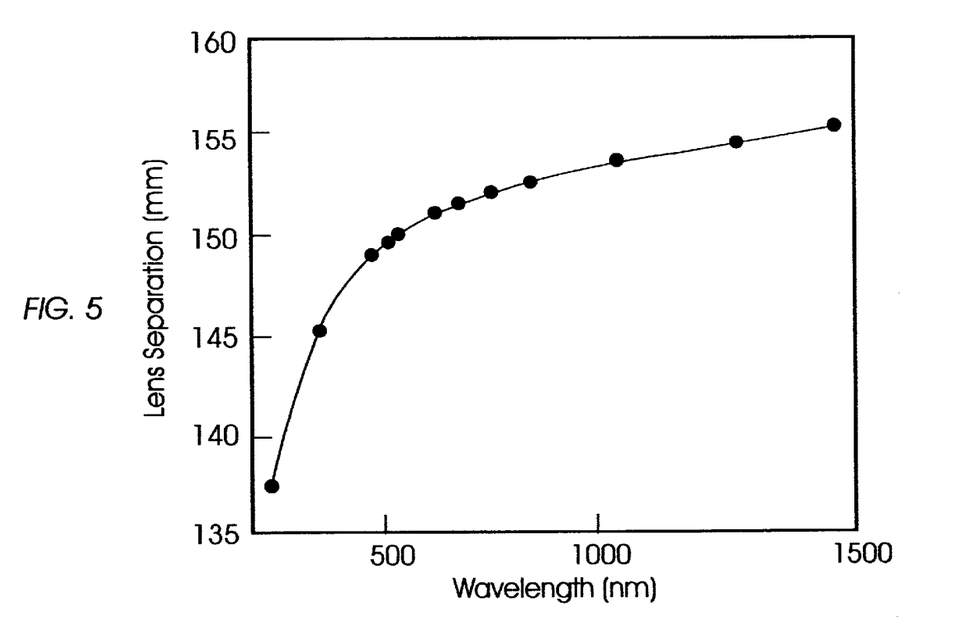
FIG. 5 is a graph showing lens spacing as a function of wavelength for optimum performance according to the present invention.

FIG. 5 shows the required spacing between the two aspheric surfaces as a function of wavelength. The design procedure is applicable at any wavelength for which transparent materials exist, including the deep ultraviolet and far infrared regions, both of which are of technological importance.

Tolerancing calculations indicate that the design of the present invention does not place unreasonable demands on surface accuracy or positioning of the components. In practice, the shape of the laser beam may deviate from an ideal Gaussian distribution, so it is also important to consider the effect that such a deviation has on the output of the optical system of the present invention. Suppose that the optics have been fabricated according to the design described above, but that instead of the nominal input distribution f(r), the light source is actually described by some modified distribution $f_1(r)$. Consequently, the output intensity distribution is modified to $g_1(R)$. Energy conservation provides that the modified functions satisfy $$\int_0^r f_1(s)s\,ds = \int_0^R g_1(s)s\,ds, \quad (15)$$

where r and R are related by the ray-tracing function of Eq. (4). Differentiating Eqs. (4) and (15) with respect to R yields $$g_1(R)=g(R)f_1(r)/f(r). \quad (16)$$

This result takes a particularly simple form for the case in which the input beam is Gaussian and has a beam waist parameter $w_1$ that deviates from the design value w. Then, Eq. (16) reduces to $$g_1=g(R)(w/w_1)^2 e^{-2r^2(w_1^{-1}-w^{-2})}. \quad (17)$$

This means that if a uniformity is required to exceed some value U, then the beam waist parameter must be controlled to a tolerance $(1-U)/2$ f or the optics to function without appreciable loss of efficiency.

An other important consideration for practical applications is the range over which the beam retains its uniform intensity. Assume that a plane wave is generated having the desired intensity distribution at the output pupil. In the ray-optics approximation, the resulting output beam would propagate forever without changing its shape. Diffraction, in fact, modifies the intensity distribution, resulting in a beam that becomes less uniform as it propagates. Diffraction is ignored in designs that strive for a sharp cut-off, such as the intensity distribution of Eq. (9). Effects of diffraction in the farfield limit can be estimated by applying Kirchoff's theory of diffraction together with the paraxial approximation. If the amplitude of the optical field at the output aperture of the apodizer is denoted u(p), then after propagating a distance D, the amplitude at a distance x from the beam axis is given by $$u(x, D) = \int_0^a \rho u(\rho) J_0(k\rho x/D) e^{ik\rho^2/2D} d\rho, \quad (18)$$

where a denotes the exit pupil radius, $k=2\pi/\lambda$ is the wavenumber of the light, and $J_0$ is the Bessel function of order 0.

Evaluating the Kirchoff integral for a plane wave having a Fermi-Dirac intensity distribution and the shape parameters given in Eqs. (13) and (14), and assuming a wavelength of 532 nm, the useful range of the beam described above is found to be of order 1 to 2 m, depending on the required uniformity tolerance. This is fully adequate for many laboratory and industrial applications. If, however, the output intensity distribution falls off too rapidly, the effects of diffraction become much more severe. For instance, if W in the exemplary design described above is reduced by an order of magnitude, leaving the rest of the design the same, then diffraction severely distorts the beam shape after less than 20 cm.

Figure 6:
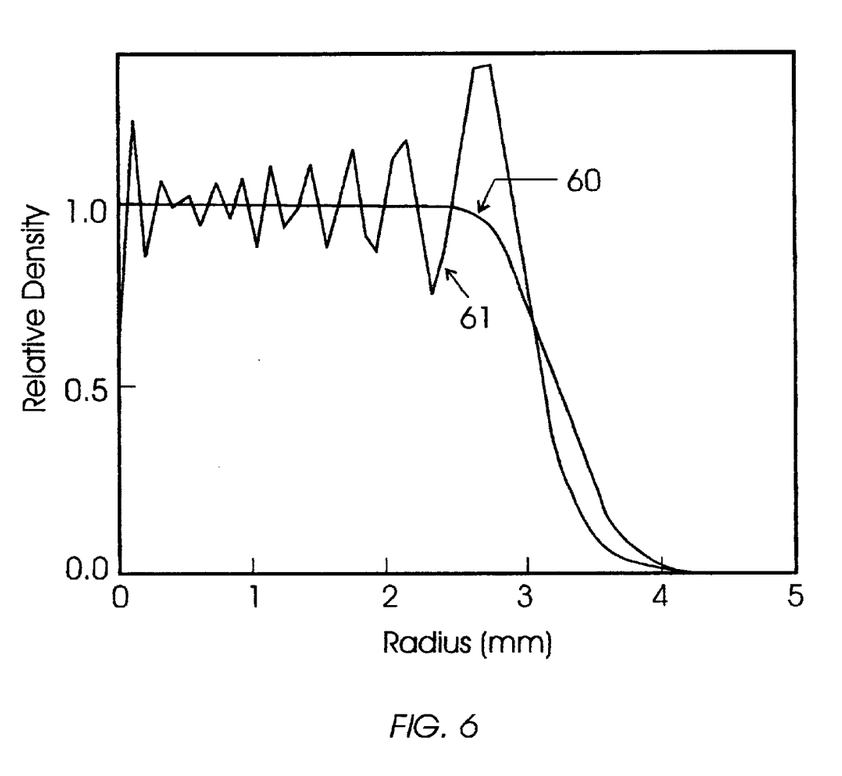
FIG. 6 is a graph showing the relative intensity distributions for two Fermi-Dirac distributions having $R_0=3.25$ mm and different W parameters after propagating 1 m.

Eq (18) was evaluated numerically for D=1 m and a wavelength of 532 nm, with u(p) being the square root of the intensity function for each of the two Fermi-Dirac functions, with $R_0=3.25$ mm and W=0.2 mm (rounded roll-off). The resulting u(x, D) was squared for obtaining the diffracted intensity distributions shown. FIG. 6 shows the relative intensity distributions for two Fermi-Dirac distributions having $R_0=3.25$ mm after propagating 1 m. Smooth curve 60 corresponds to W=0.2 mm, and is virtually indistinguishable for the initial Fermi-Dirac function. Oscillating curve 61 corresponds to W=0.02 mm, and shows oscillations of up to 40% about the nominal intensity. Thus, FIG. 6 shows the importance of controlling the output intensity roll-off when the range over which uniform illumination is maintained is a concern.

An essential feature of the optical system of the present invention is that it produces a collimated flattop beam, i.e., a beam that retains its intensity profile as it propagates. The constancy of the beam profile is an important consideration for many useful applications, including projection optics (e.g., displays and lithographic tools) with variable working distance, and laser amplifiers in which the beam propagates through a long gain medium. Consequently, it is highly desirable to maximize the range over which the beam retains its flattop profile.

To make this notion quantitative, the useful range of the output beam can be defined as the distance d over which some predetermined fraction of the total input power is enclosed in a region in which the power varies by less than some predetermined tolerance. As previously noted, diffraction places a fundamental limit on d. The present invention provides a technique for designing an output beam having a controlled roll-off, such as by choosing a Fermi-Dirac or super-Gaussian profile, for reducing the effects of diffraction to any desired degree. In practice, the useful range of the output beam is often limited not by diffraction, but by imperfections in the fabrication of the aspheric surfaces making up the Gauss to flattop converter. Specifically, it is often difficult to maintain the desired surface figure in the immediate neighborhood of the optical axis to a precision better than approximately 100 nm. Such a small deviation of the fabricated surfaces from an intended shape can have a surprisingly deleterious effect on the performance of the optical system, and particularly on the profile of the beam as it propagates.

Experimentally, it is observed that immediately after the exit aperture of the optical system the beam has very nearly the desired intensity distribution. As the beam propagates, though, a "hole" or region of abnormally low intensity, develops in the center region of the beam. Other deviations from an ideal profile may also be encountered, but the "hole" is usually the most prominent aberration. The origin of such an effect is caused by imperfections of the optical elements, and may be understood simply in terms of ray optics, as follows. If the lenses were perfect, all rays would exit the optical system parallel to the optical axis. The effect of deviations of the fabricated surfaces from the ideal figure is that rays exit the system at some small angle $\delta\theta$ to the optical axis. Suppose for simplicity that near the optical axis, the angle $\delta\theta$ is constant. (This assumption is not essential.) After propagating a distance $b=\delta\theta$, all of the rays within radius a of the optical axis will have diverged from the axis by at least the distance a, and there will be a "hole" of radius a in the intensity distribution.

The useful range of the Gauss-to-flattop optics can be dramatically improved if the system of aspherical lenses of the present invention described above is followed by a beam expander of magnification M>1. This is a widely used optical device, which in its simplest implementation is constructed from two spherical lenses having respective focal lengths $f_1$ and $f_2$ in a confocal arrangement, i.e., separated by a distance equal to $f_1+f_2$. The output lens $f_2$ is positive, while the input lens $f_1$ may be either positive or negative.

The effect of the system is to then transform an incoming beam into an outgoing beam in which linear dimensions are expanded by the factor $M=|f_2/f_1|$, while angular deviations are reduced by the factor M. Of course more elaborate implementations are possible without changing the essential idea. Referring to the foregoing discussion of the effects of figure error, it can be seen that because the beam expander reduces δθ by a factor of M, the radius of the "hole" (in absolute dimensions) that evolves after the beam has propagated some given distance is smaller by a factor of M than for the unexpanded beam. Moreover, because the linear dimensions of the beam itself have been increased by a factor M the size of the "hole" relative to the total beam size is reduced by a factor $M^2$, and the fractional intensity that is affected is reduced by $M^4$. If instead, the distance that the beam propagates before the "hole" has a given size relative to the beam diameter is considered, it is easy to see that the beam expander increases the range by a factor of $M^2$. From these considerations, it is clear that even a modest value of M can greatly increase the useful range of the output beam.

Note that although a rather simple model of the evolution of a "hole" in the center of the beam has been considered, the argument applies quite generally to any departure of the beam profile from the desired form that can be described in terms of ray optics as being due to an error in the propagation direction of the output rays. This is because the general property of beam expander is that it magnifies linear dimensions and demagnifies angular dimensions both by the same factor M.

Figure 7:
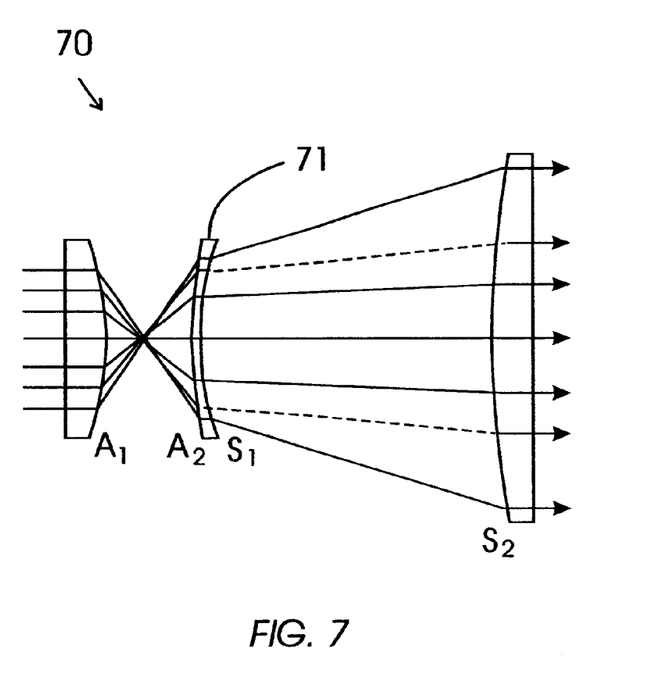
FIG. 7 shows an optical system having the aspherical optics of the present invention integrated with a beam expander.

Because some degree of imperfection is inherent in the fabrication of all optical elements, with aspherical surfaces being especially difficult to fabricate, it is advantageous when designing a system for uniform illumination to follow the aspherical Gauss-to-flattop optics by a beam expander that reduces the effects of fabrication errors and increases the useful range of the output beam, as described above. The aspherical optics and the beam expander can be integrated, as shown in FIG. 7 as optical system 70. Such a configuration has the advantage of simplifying optical alignment and minimizing the distance that the beam propagates between the aspherical system and the beam expander.

In FIG. 7, surfaces $A_1$ and $A_2$ denote the aspherical surfaces that convert a collimated Gaussian beam to a collimated flattop beam, as described above. Surfaces $S_1$ and $S_2$ are spherical surfaces that together form a beam expander of magnification M. Optical element 71 performs the function both of the output lens of the Gauss-to-flattop converter and the input lens of the beam expander. FIG. 7 is drawn with $S_1$ shown as concave (i.e., the beam expander is shown having $f_1<0$), but as explained above, $S_1$ can also be convex ($f_1>0$), in which case there would be an intermediate focus located between the second and third optical elements. The second optical element can be fabricated by sequentially polishing the surfaces $A_2$ and $S_1$, or by joining two separately ground and polished elements using an optical adhesive or optical contact.

While the present invention has been described in connection with the illustrated embodiments, it will be appreciated and understood that modifications may be made without departing from the true spirit and scope of the invention.

What is claimed is:

1. An optical system, comprising:
   a first optical element having an aspherical surface; and
   a second optical element having an aspherical surface, the first and second optical elements being arranged in a Keplerian configuration, and the aspheric surface of the second optical element being related to the aspheric surface of the first optical element by a ray-tracing function that maps substantially all of an input light beam that is incident to the first optical element to an output light beam that is output from the second optical element, the input light beam having a first axially-symmetric intensity distribution and the output light beam having a second axially-symmetric intensity distribution.

2. The optical system according to claim 1, wherein each aspheric surface of the first and second first and second optical elements has a monotonical radial dependence from a center region of the aspheric surface.

3. The optical system according to claim 1, wherein a prescription for each aspheric surface is a single integral equation.

4. The optical system according to claim 1, wherein the input light beam has a Gaussian intensity distribution.

5. The optical system according to claim 1, wherein the light output beam has a Fermi-Dirac intensity distribution.

6. The optical system according to claim 1, wherein the light output beam has a continuous, sigmoidal intensity distribution function.

7. The optical system according to claim 1, wherein the ray-tracing function maps the input light beam to the output beam to a $1/e^6$ intensity radius of the input light beam.

8. The optical system according to claim 1, wherein the first and second optical elements are each positive aspheric elements.

9. The optical system according to claim 1, wherein the aspheric surface of the first optical element has deviations from sphericity less than about 20 $\mu$m.

10. The optical system according to claim 1, wherein the output light beam is a collimated light beam.

11. The optical system according to claim 1, wherein the output light beam is a collimated light beam over an input light beam wavelength range from 257 nm to 1550 nm.

12. The optical system according to claim 1, wherein the first and second optical elements are formed from one of fused silica and optical glass.

13. The optical system according to claim 1, further comprising:
   a third optical element having a spherical surface, the spherical surface of the third optical element having a focal length $f_1$, the output light beam passing through the spherical surface of the third optical element after passing through the second aspheric surface of the second optical element; and
   a fourth optical element having a spherical surface, the spherical surface of the fourth optical element having a focal length $f_2$, the spherical surfaces of the third and fourth optical elements forming a beam expander having a magnification factor.

14. The optical system according to claim 13, wherein the magnification factor M is defined to be $M=|f_2/f_1|$.

15. The optical system according to claim 13, wherein the second optical element and the third optical element are the same optical element.

* * * * *